US012776721B2

(12) United States Patent
Arai et al.

(10) Patent No.: US 12,776,721 B2
(45) Date of Patent: Oct. 27, 2026

(54) POWER SEMICONDUCTOR MODULE AND POWER CONVERSION DEVICE USING THE SAME

(71) Applicant: HITACHI POWER SEMICONDUCTOR DEVICE, LTD., Hitachi (JP)

(72) Inventors: Taiga Arai, Hitachi (JP); Daisuke Kawase, Hitachi (JP); Akira Mima, Tokyo (JP); Katsuaki Saito, Hitachi (JP)

(73) Assignee: MINEBEA POWER SEMICONDUCTOR DEVICE INC., Ibaraki (JP)

( * ) Notice: Subject to any disclaimer, the term of this patent is extended or adjusted under 35 U.S.C. 154(b) by 356 days.

(21) Appl. No.: 18/578,429

(22) PCT Filed: May 10, 2022

(86) PCT No.: PCT/JP2022/019782

§ 371 (c)(1),
(2) Date: Jan. 11, 2024

(87) PCT Pub. No.: WO2023/002739

PCT Pub. Date: Jan. 26, 2023

(65) Prior Publication Data

US 2024/0297592 A1 Sep. 5, 2024

(30) Foreign Application Priority Data

Jul. 19, 2021 (JP) ................................ 2021-118515

(51) Int. Cl.
*H02M 7/00* (2006.01)
*H02M 1/44* (2007.01)
(Continued)

(52) U.S. Cl.
CPC ............ *H02M 7/003* (2013.01); *H02M 1/44* (2013.01); *H05K 9/0007* (2013.01);
(Continued)

(58) Field of Classification Search
CPC .......... H02M 1/08; H02M 1/32; H02M 7/537; H02M 1/0009; H02M 1/44; H02M 5/4585;
(Continued)

(56) References Cited

U.S. PATENT DOCUMENTS 3,982,216 A * 9/1976 Mitsuhashi ............ H01H 67/30 335/112
4,893,078 A * 1/1990 Auchterlonie ........... G01B 7/14 318/660
(Continued)

FOREIGN PATENT DOCUMENTS

JP 2003-046058 A 2/2003
JP 2009-021345 A 1/2009
(Continued)

OTHER PUBLICATIONS

Extended European Search Report, mailed Jun. 20, 2025, for European Application No. 22845677.8.
(Continued)

*Primary Examiner* — Maliheh Malek
(74) *Attorney, Agent, or Firm* — Baker Botts L.L.P.

(57) ABSTRACT

Provided is a power semiconductor module comprising: a gate terminal to which a control signal is inputted; a reference potential terminal disposed adjacent to the gate terminal with a predetermined interval from the gate terminal; a main circuit wiring disposed in the vicinity of the reference potential terminal and the gate terminal; and an electromagnetic shield disposed between the gate terminal and the reference potential terminal to shield induction field gener-
(Continued)

ated by current flowing through the main circuit wiring. The present invention is also characterized in that: the electromagnetic shield is integrally formed with the gate terminal and/or the reference potential terminal; and, in a portion between the gate terminal and the reference potential terminal, a gap that is not shielded by the electromagnetic shield as seen from a direction in which a magnetic flux of the induction field intersects with the electromagnetic shield, is 1 mm or less.

10 Claims, 7 Drawing Sheets

(51) Int. Cl.
*H05K 9/00* (2006.01)
*H10W 42/20* (2026.01)
*H01R 12/71* (2011.01)
*H10W 90/00* (2026.01)

(52) U.S. Cl.
CPC .......... *H10W 42/20* (2026.01); *H01R 12/714* (2013.01); *H10W 90/701* (2026.01)

(58) Field of Classification Search
CPC .... H02M 7/003; H02M 1/327; H01R 12/714; H01R 12/712; H01R 12/716; H10W 42/20; H10W 70/658; H10W 76/12; H10W 90/00; H10W 90/701; H05K 9/0007
See application file for complete search history.

(56) References Cited

U.S. PATENT DOCUMENTS

| | | | | |
|---|---|---|---|---|
| 5,312,674 | A * | 5/1994 | Haertling | H05K 1/165 428/209 |
| 5,617,293 | A * | 4/1997 | Schulze | H02M 7/003 257/713 |
| 5,656,857 | A * | 8/1997 | Kishita | H10W 42/00 257/E23.114 |
| 5,956,231 | A * | 9/1999 | Yamada | H02M 7/003 361/728 |
| 6,188,589 | B1 * | 2/2001 | Okayama | H02M 7/521 363/136 |
| 7,141,741 | B2 * | 11/2006 | Yamada | H02M 7/003 257/E23.044 |
| 9,406,624 | B2 * | 8/2016 | Yoneyama | H10W 42/20 |
| 9,685,879 | B2 * | 6/2017 | Obiraki | H02M 7/003 |
| 9,966,344 | B2 * | 5/2018 | Soyano | H02M 7/003 |
| 9,997,495 | B2 * | 6/2018 | Burger | H04B 5/24 |
| 10,027,250 | B2 * | 7/2018 | Nomura | H02M 1/08 |
| 11,432,419 | B2 * | 8/2022 | Suwa | H02M 7/537 |
| 11,937,413 | B2 * | 3/2024 | Reiter | H02M 1/327 |
| 2002/0027283 | A1 * | 3/2002 | Hiyoshi | H10W 90/00 257/703 |
| 2004/0125529 | A1 * | 7/2004 | Arai | H10W 42/20 257/E23.114 |
| 2006/0284211 | A1 * | 12/2006 | Takubo | H02M 7/003 257/E25.031 |
| 2009/0140414 | A1 * | 6/2009 | Soyano | H10W 90/00 257/E23.142 |
| 2009/0257211 | A1 * | 10/2009 | Kontani | H01G 2/06 361/782 |
| 2011/0062491 | A1 * | 3/2011 | Nakata | H10W 44/501 257/146 |
| 2011/0285312 | A1 * | 11/2011 | Choutov | H05B 45/375 336/200 |
| 2011/0316494 | A1 * | 12/2011 | Kitamura | H02M 1/088 257/77 |
| 2012/0218716 | A1 * | 8/2012 | Asakura | H10W 40/611 361/717 |
| 2013/0063067 | A1 * | 3/2013 | Tanaka | B60L 15/007 257/77 |
| 2013/0265808 | A1 * | 10/2013 | Ishii | H02M 1/12 363/97 |
| 2015/0069545 | A1 * | 3/2015 | Noma | H10N 50/01 257/421 |
| 2015/0250074 | A1 * | 9/2015 | Matsumoto | H05K 7/20336 165/104.21 |
| 2016/0093788 | A1 * | 3/2016 | Matsumoto | H05K 7/20336 136/212 |
| 2016/0155706 | A1 * | 6/2016 | Yoneyama | H10W 42/20 257/77 |
| 2016/0226396 | A1 * | 8/2016 | Hattori | H02M 7/003 |
| 2016/0276938 | A1 * | 9/2016 | Mima | H02J 1/10 |
| 2016/0373017 | A1 * | 12/2016 | Mima | H02M 7/2173 |
| 2017/0040906 | A1 * | 2/2017 | Hattori | H02M 5/458 |
| 2018/0006573 | A1 * | 1/2018 | Hattori | H02M 7/5387 |
| 2018/0278172 | A1 * | 9/2018 | Tokuyama | H02M 7/003 |
| 2019/0068045 | A1 * | 2/2019 | Ramabhadran | H01F 27/292 |
| 2019/0206810 | A1 * | 7/2019 | Kanai | H02M 1/34 |
| 2019/0386577 | A1 * | 12/2019 | Ishii | H02M 1/44 |
| 2020/0068735 | A1 * | 2/2020 | Suwa | H02M 7/537 |
| 2020/0186142 | A1 * | 6/2020 | Balaz | H02M 1/08 |
| 2020/0196432 | A1 * | 6/2020 | Hata | H01R 12/714 |
| 2020/0243487 | A1 * | 7/2020 | Or-Bach | H10D 84/0149 |
| 2021/0288640 | A1 * | 9/2021 | Masuda | B60L 9/005 |
| 2021/0296979 | A1 * | 9/2021 | Ikarashi | H02M 1/32 |
| 2022/0278608 | A1 * | 9/2022 | Carden | H02M 1/40 |
| 2023/0068505 | A1 * | 3/2023 | Or-Bach | H10D 84/0149 |
| 2023/0344330 | A1 * | 10/2023 | Yamakaji | H02M 1/0012 |
| 2024/0106337 | A1 * | 3/2024 | Choi | B60L 15/007 |
| 2024/0223106 | A1 * | 7/2024 | Preindl | H02M 1/0058 |
| 2024/0290698 | A1 * | 8/2024 | Masuda | H02M 7/003 |
| 2024/0297592 | A1 * | 9/2024 | Arai | H02M 7/003 |
| 2025/0006566 | A1 * | 1/2025 | Tsuyuno | H02M 7/003 |
| 2025/0112631 | A1 * | 4/2025 | Arai | H02M 7/003 |
| 2025/0202379 | A1 * | 6/2025 | Mima | H02M 1/32 |
| 2025/0301913 | A1 * | 9/2025 | Adachi | H10N 50/10 |
| 2026/0011656 | A1 * | 1/2026 | Notake | H02M 1/126 |

FOREIGN PATENT DOCUMENTS

| | | | |
|---|---|---|---|
| JP | 2011-238645 | A | 11/2011 |
| JP | 2014-155382 | A | 8/2014 |
| JP | 2014-175432 | A | 9/2014 |
| WO | WO 2017/056686 | A1 | 4/2017 |

OTHER PUBLICATIONS

International Search Report, mailed Aug. 2, 2022, for International Application No. PCT/JP2022/019782.

* cited by examiner

POWER SEMICONDUCTOR MODULE AND POWER CONVERSION DEVICE USING THE SAME

TECHNICAL FIELD

The present invention relates to an internal wiring structure of a power semiconductor module, and particularly relates to an effective technique to be applied to a power semiconductor module having a high output density in which a large current flows in a main circuit inside the module.

BACKGROUND ART

In recent years, because of a demand for higher output density of an inverter device as a power conversion device, reduction in size and in weight of a power conversion device is in progress, and there is also a strong demand for higher output density, reduction in size and in weight of a power semiconductor module mounted on a power conversion device.

The power conversion device has a function of converting DC power supplied from a DC power supply into AC power to be supplied to an AC electric load such as a rotating electrical machine, or a function of converting AC power generated by the rotating electrical machine into DC power to be supplied to the DC power supply. In order to achieve such a conversion function, the power conversion device includes an inverter circuit having a power semiconductor module, and the power semiconductor module repeats conduction operation and cutoff operation to perform power conversion from DC power to AC power or from AC power to DC power.

The power semiconductor module includes an input terminal that controls conduction operation and cutoff operation. For example, in a case of an element having an insulated gate control terminal such as a metal-oxide-semiconductor field effect transistor (Metal-Oxide-Semiconductor Field Effect Transistor, hereinafter MOSFET) or an insulated gate bipolar transistor (Insulated Gate Bipolar Transistor, hereinafter IGBT), it is possible to amplify and control a main voltage more than several tens of times to several hundreds of times and a main current more than several 1000 times by inputting a voltage signal of several V to several tens of V.

On the other hand, even a weak noise to the insulated gate control terminal greatly affects an output due to amplification, and thus countermeasures are required.

As a background art of the present technical field, for example, there is such a technique as recited in PTL 1. PTL 1 discloses "a power module including: a first control electrode 12 electrically connected to a control signal input electrode; and a second control electrode 11 electrically connected to a control signal reference electrode, in which a magnetic shield film is bonded to the first control electrode and the second control electrode so as to surround them".

In addition, PTL 2 discloses "a power semiconductor module including a gate pattern 37 having an induction generation pattern 34 that is not shielded by an emitter pattern 28 and extends in a direction parallel to a direction in which a current of a main electrode terminal 20 flows".

CITATION LIST

Patent Literatures

PTL 1: JP 2014-175432 A
PTL 2: JP 2009-21345 A

SUMMARY OF INVENTION

Technical Problem

In a power semiconductor module mounted on such a power conversion device as described above, an induction magnetic field generated by a large current flowing through a main circuit in the power semiconductor module affects a signal wiring of a gate circuit or the like. In particular, in a case of positive feedback in which an induced current generated by an induction magnetic field is in the same direction as that of a gate drive signal, since turn-on is accelerated at the time of switching, a problem occurs that a voltage jumps due to transient response, or a transient current flows. Such influence of positive feedback increases the transient response, which causes malfunction of the power semiconductor module and breakdown due to excessive voltage and current.

Since such a magnetic shield film as described above is bonded later, PTL 1 has a problem that the number of manufacturing steps increases.

Further, while reciting the influence of positive feedback or negative feedback, PTL 2 mentions nothing about a shield structure that directly shields an induction magnetic field.

Therefore, an object of the present invention is to provide a highly reliable power semiconductor module in which a gate terminal and an emitter sense terminal are disposed adjacent to each other and a main circuit wiring is disposed in the vicinity thereof, the power semiconductor module being capable of effectively suppressing an influence of an induction magnetic field generated by a current flowing through the main circuit wiring on the gate terminal and the emitter sense terminal.

Solution to Problem

In order to solve the above problems, the present invention includes: a gate terminal to which a control signal is input; a reference potential terminal disposed adjacent to the gate terminal with a predetermined gap; a main circuit wiring disposed in the vicinity of the gate terminal and the reference potential terminal; and an electromagnetic shield that is disposed between the gate terminal and the reference potential terminal and shields an induction magnetic field generated by a current flowing through the main circuit wiring, in which the electromagnetic shield is formed integrally with at least one of the gate terminal and the reference potential terminal, and between the gate terminal and the reference potential terminal, a gap not shielded by the electromagnetic shield when viewed from a direction in which a magnetic flux of the induction magnetic field interlinks with the electromagnetic shield, is 1 mm or less.

Advantageous Effects of Invention

According to the present invention, a highly reliable power semiconductor module can be realized in which a gate terminal and an emitter sense terminal are disposed adjacent to each other and a main circuit wiring is disposed in the vicinity thereof, the power semiconductor module being capable of effectively suppressing an influence of an induction magnetic field generated by a current flowing through the main circuit wiring on the gate terminal and the emitter sense terminal.

As a result, it is possible to suppress an increase in transient response due to an influence of positive feedback at the time of switching and to prevent malfunction of the power semiconductor module and breakdown due to excessive voltage and current.

Problems, configurations, and effects other than those described above will be clarified by the following description of embodiments.

DESCRIPTION OF EMBODIMENTS

Figure 1:
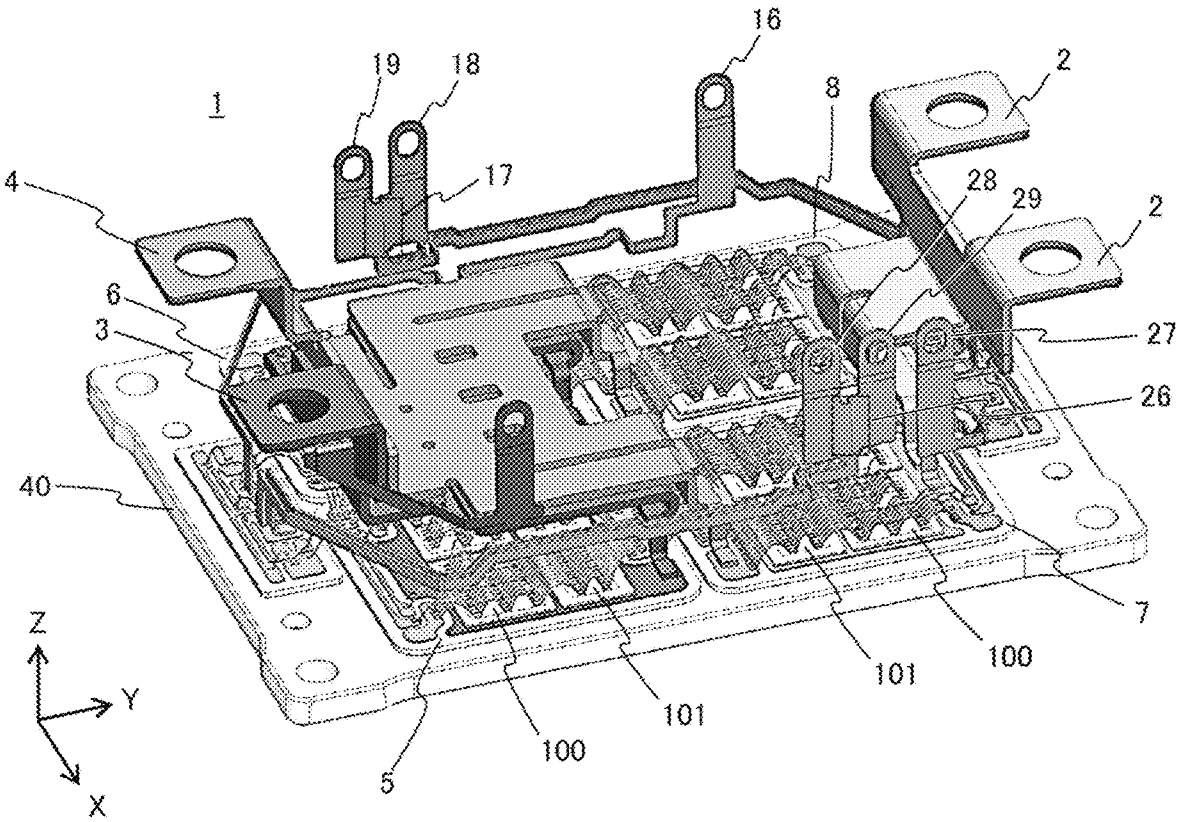
FIG. 1 is a perspective view showing an internal wiring structure of a power semiconductor module according to a first embodiment of the present invention.

In the following, embodiments of the present invention will be described with reference to the drawings. In the drawings, the same components are denoted by the same reference numerals, and detailed description of overlapping parts is omitted.

First Embodiment

Figure 2:
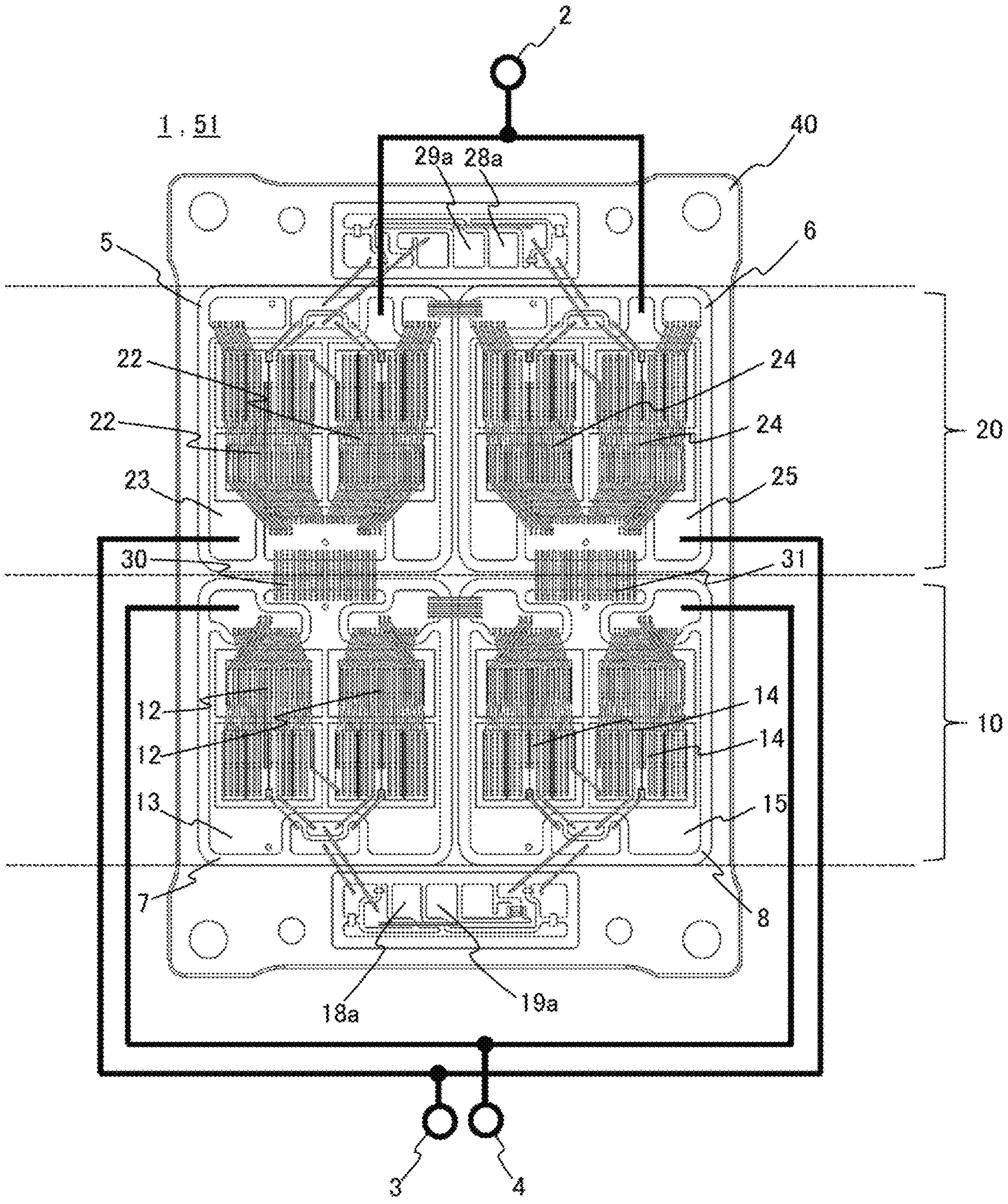
FIG. 2 is a top view of the internal wiring structure of the power semiconductor module in FIG. 1.
Figure 3:
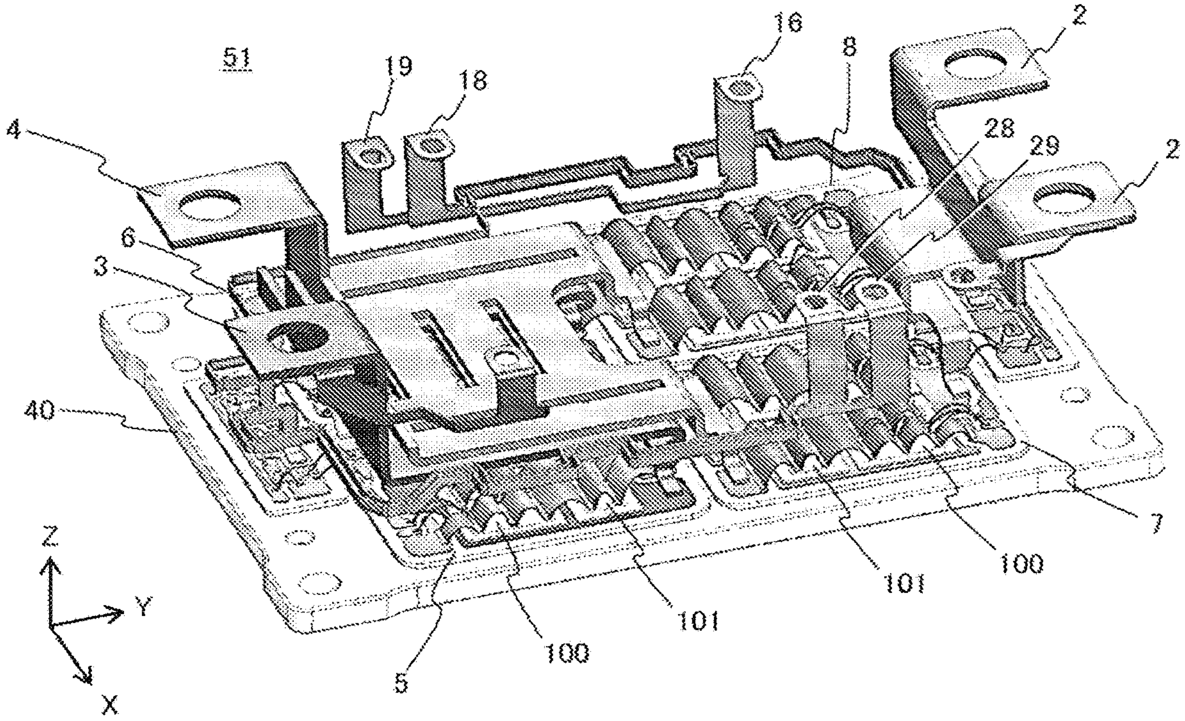
FIG. 3 (Prior Art)
FIG. 3 is a perspective view illustrating an internal wiring structure of a conventional power semiconductor module.
Figure 4A:
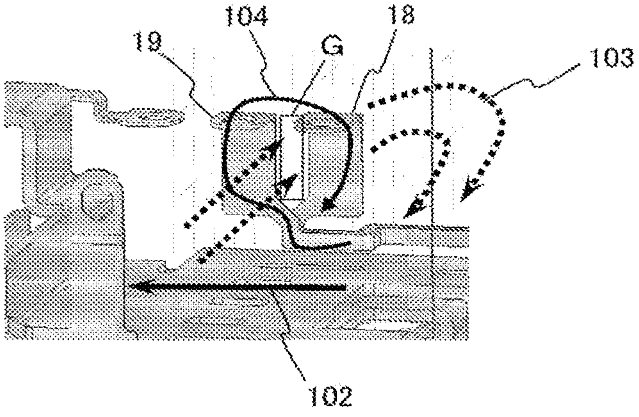
FIG. 4A (Prior Art)
FIG. 4A is an enlarged view of the vicinity of a gate terminal and an emitter sense terminal of the conventional power semiconductor module.

A power semiconductor module according to a first embodiment of the present invention will be described with reference to FIGS. 1 to 5B. FIGS. 3 and 4A are views of an internal wiring structure of a conventional power semiconductor module for the sake of easy understanding of the present invention.

First, an internal wiring structure of the power semiconductor module according to the present embodiment will be described with reference to FIGS. 1 and 2. FIG. 1 is a perspective view illustrating an internal wiring structure of a power semiconductor module 1 of the present embodiment. FIG. 2 is a top view of the internal wiring structure of the power semiconductor module 1 in FIG. 1. Although arrangement of each configuration is slightly different between FIGS. 1 and 2, a configuration related to the present invention is basically the same.

As illustrated in FIGS. 1 and 2, the power semiconductor module 1 of the present embodiment has a structure in which an upper arm part 20 in which a plurality of IGBT chips 100 are connected in parallel and a lower arm part 10 in which a plurality of IGBT chips 100 are similarly connected in parallel are mounted on a base plate 40, and the upper arm part 20 and the lower arm part 10 are connected by wirings 30 and 31 and are further connected to an AC terminal 2.

A diode chip 101 is connected in reverse parallel to each of the plurality of IGBT chips 100, and the diode chip 101 functions as a freewheeling diode.

In the upper arm part 20, a first insulating wiring board 5 of the upper arm part on which the plurality of IGBT chips 100 and the plurality of diode chips 101 are mounted and a second insulating wiring board 6 of the upper arm part on which the plurality of IGBT chips 100 and the plurality of diode chips 101 are mounted are connected in parallel to each other.

The first insulating wiring board 5 includes an emitter wiring part 22 for connecting an emitter part of the IGBT chip 100 and a collector wiring part 23 for connecting a collector part of the IGBT chip 100.

In addition, the second insulating wiring board 6 includes an emitter wiring part 24 for connecting the emitter part of the IGBT chip 100 and a collector wiring part 25 for connecting the collector part of the IGBT chip 100.

The collector wiring part 23 of the first insulating wiring board 5 and the collector wiring part 25 of the second insulating wiring board 6 are connected to a positive electrode terminal 3.

In addition, as control signal wirings for the IGBT chips 100 mounted on the first insulating wiring board 5 and the second insulating wiring board 6, connected to the upper arm part 20 are a gate terminal connection part 28*a* connected to a gate terminal 28 of the upper arm part and an emitter sense terminal connection part 29*a* connected to an emitter sense terminal 29 of the upper arm part.

In the lower arm part 10, a third insulating wiring board 7 of the lower arm part on which the plurality of IGBT chips 100 and the plurality of diode chips 101 are mounted and a fourth insulating wiring board 8 of the lower arm part on which the plurality of IGBT chips 100 and the plurality of diode chips 101 are mounted are connected in parallel to each other.

The third insulating wiring board 7 includes an emitter wiring part 12 for connecting the emitter part of the IGBT chip 100 and a collector wiring part 13 for connecting the collector part of the IGBT chip 100.

In addition, the fourth insulating wiring board 8 includes an emitter wiring part 14 for connecting the emitter part of the IGBT chip 100 and a collector wiring part 15 for connecting the collector part of the IGBT chip 100.

The emitter wiring part 12 of the third insulating wiring board 7 and the emitter wiring part 14 of the fourth insulating wiring board 8 are connected to a negative electrode terminal 4.

In addition, as control signal wirings for the IGBT chips 100 mounted on the third insulating wiring board 7 and the fourth insulating wiring board 8, connected to the lower arm part 10 are a gate terminal connection part 18*a* connected to a gate terminal 18 of the lower arm part and an emitter sense terminal connection part 19*a* connected to an emitter sense terminal 19 of the lower arm part.

Although the present embodiment and other embodiments are described with respect to an example in which an IGBT is used as the switching element, the present invention is not limited thereto, and a MOSFET may be used as the switching element.

In a case of a MOSFET, an emitter may be replaced with a source, and a collector may be replaced with a drain. The emitter sense terminal (19, 29) or a source sense terminal is also referred to as a reference potential terminal.

For comparison with the present embodiment (FIG. 1), FIG. 3 shows an internal wiring structure of a conventional power semiconductor module 51. Note that a top view corresponds to FIG. 2 as in the present embodiment (FIG. 1).

In the power semiconductor module 1 of the present embodiment (FIG. 1) and the power semiconductor module 51 having a conventional structure, shapes of the gate terminal 18 of the lower arm part and the emitter sense terminal 19 of the lower arm part of the control signal wiring for the IGBT chip 100, and shapes of the gate terminal 28 of the upper arm part and the emitter sense terminal 29 of the upper arm part are different from each other.

Figure 4B:
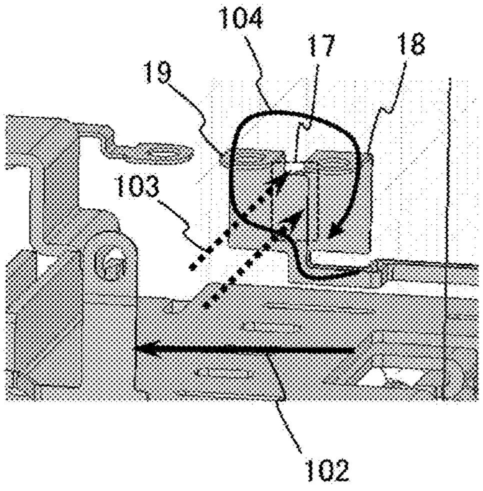
FIG. 4B is an enlarged view of the vicinity of a gate terminal and an emitter sense terminal of the power semiconductor module in FIG. 1.

A difference between these shapes will be described with reference to FIGS. 4A and 4B. FIG. 4A is an enlarged view of the vicinity of the gate terminal 18 and the emitter sense terminal 19 of the conventional power semiconductor module 51. FIG. 4B is an enlarged view of the vicinity of the gate terminal 18 and the emitter sense terminal 19 of the power semiconductor module 1 of the present embodiment (FIG. 1).

In the power semiconductor module, at the time of switching (turn-on) from the cutoff state to the conduction state, for example, in a case of an n-channel MOS gate, a current flows from a gate to an emitter in a gate-emitter circuit.

Therefore, in the conventional power semiconductor module 51, a loop current 104 is generated as indicated by a solid line in FIG. 4A. At the same time, since a main current 102 also indicated by a solid line starts to flow through a main circuit wiring (not illustrated), an induction magnetic field 103 according to the right hand cork screw rule is generated around a main current path as indicated by a dotted line in FIG. 4A.

In the conventional structure, since the induction magnetic field 103 passes through a gap G between the gate terminal 18 and the emitter sense terminal 19 of the loop current 104, an induced current flows.

Since a direction of the induced current is the same as a direction of the loop current 104 for a turn-on signal, positive feedback occurs to further accelerate the turn-on, so that the voltage jumps due to transient response or a transient current flows.

This causes a harmonic to be generated from strong distortion in inverter operation, or causes element breakdown due to a transient voltage or a transient current.

On the other hand, in the power semiconductor module 1 of the present embodiment, as illustrated in FIGS. 1 and 4B, an electromagnetic shield part 17 is provided between the gate terminal 18 and the emitter sense terminal 19 to shield so that the induction magnetic field 103 does not escape into the loop current 104. Therefore, a problem as in the conventional structure does not occur, and high inverter performance and reliability can be expected.

The electromagnetic shield part 17 is desirably formed integrally with at least one of the gate terminal 18 and the emitter sense terminal 19. FIG. 4B illustrates an example in which the electromagnetic shield part 17 is integrally formed with the emitter sense terminal 19.

It is preferable that the electromagnetic shield part 17 is installed so as to close the gap G when viewed from a direction in which a magnetic flux of the induction magnetic field 103 interlinks with the electromagnetic shield part 17, and is installed between the gate terminal 18 and the emitter sense terminal 19 so that the gap G not shielded by the electromagnetic shield part 17 is 1 mm or less.

Figure 5A:
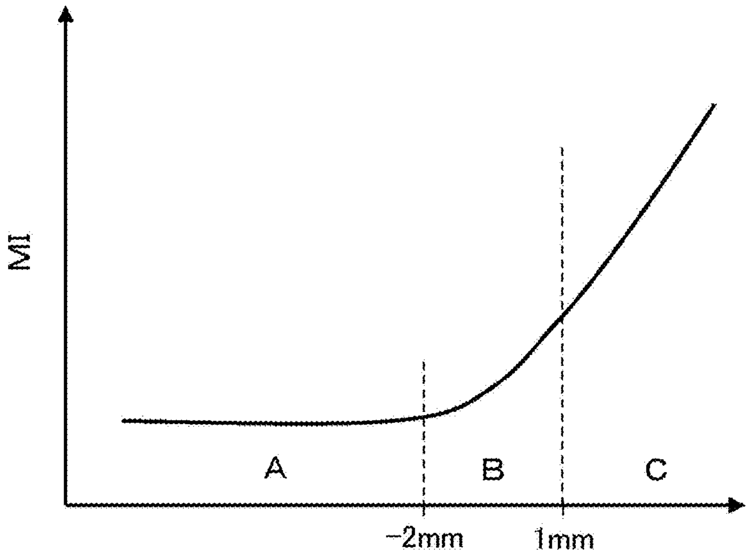
FIG. 5A is a diagram illustrating a relationship between a gap between the gate terminal and the emitter sense terminal and a mutual inductance (MI) (a case of positive feedback).
Figure 5B:
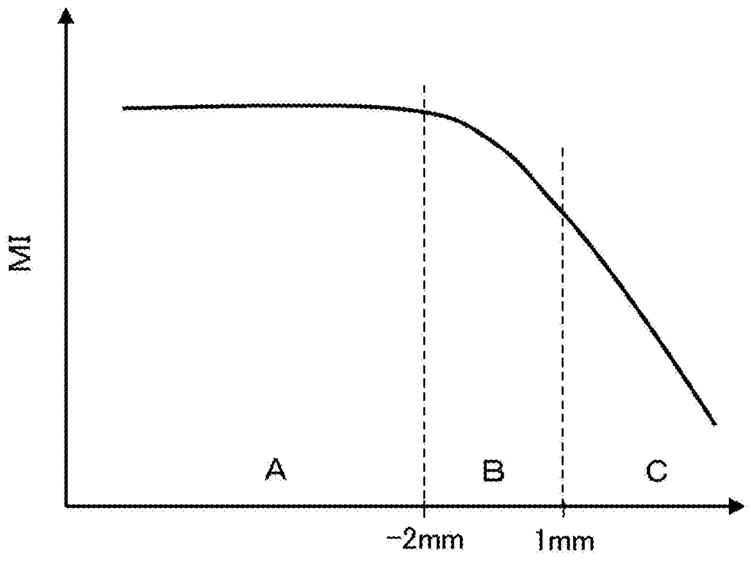
FIG. 5B is a diagram illustrating a relationship between the gap between the gate terminal and the emitter sense terminal and the mutual inductance (MI) (a case of negative feedback).

The reason for this will be described with reference to FIGS. 5A and 5B. FIG. 5A is a diagram illustrating a relationship between the gap between the gate terminal 18 and the emitter sense terminal 19 and a mutual inductance (MI) in the case of positive feedback. FIG. 5B is a diagram illustrating a relationship between the gap between the gate terminal 18 and the emitter sense terminal 19 and the mutual inductance (MI) in the case of negative feedback. FIGS. 5A and 5B are the schematic diagrams of results of simulation based on the model of FIG. 1, in which a gap between the gate terminal 18 and the emitter sense terminal 19 in a depth direction (the direction in which the magnetic flux of the induction magnetic field 103 interlinks with the electromagnetic shield part 17) is 1 mm.

In FIGS. 5A and 5B, the horizontal axis indicates a size of the gap that is not shielded by the electromagnetic shield part 17 when viewed from the direction in which the magnetic flux of the induction magnetic field 103 interlinks with the electromagnetic shield part 17. A positive numerical value represents that the gap is not shielded by the electromagnetic shield part 17, and a negative numerical value represents that the gap is 0 mm as a result of shielding by the electromagnetic shield part 17, and that there is an overlap between the electromagnetic shield part 17 and another member (any of the gate terminal 18, the emitter sense terminal 19, and the other electromagnetic shield part 17) that is not integrally formed with the electromagnetic shield part (the gap being-2 mm means having an overlap of 2 mm).

In FIGS. 5A and 5B, a region A indicates a case where the gap is-2 mm or less (overlap is 2 mm or more), a region B indicates a case where the gap is larger than-2 mm (overlap is smaller than 2 mm) and 1 mm or less, and a region C indicates a case where the gap is larger than 1 mm. In the case of positive feedback, as illustrated in FIG. 5A, in the region A, the induction magnetic field 103 caused by the main current hardly passes through the gap between the gate terminal 18 and the emitter sense terminal 19, and an effect of the electromagnetic shield part 17 is stable. Therefore, the mutual inductance (MI) between the gate terminal 18 and the emitter sense terminal 19 does not change, and an induced current hardly flows. On the other hand, in the region B, due to wraparound, the induction magnetic field 103 starts passing through the gap, so that the mutual inductance (MI) starts to increase and the induced current starts to flow, and in the region C, the mutual inductance (MI) increases in proportion to an area of the gap, so that the loop current 104 caused by the induced current increases the transient response.

Therefore, when the gap between the gate terminal 18 and the emitter sense terminal 19 is 1 mm or less, it is possible to suppress an increase in the transient response due to positive feedback. When the gap is-2 mm or less (overlap is 2 mm or more), a more stable effect of suppressing the transient response can be obtained.

In addition, when an actual module is designed to have the gap of 0 mm, the gap can be 1 mm or less even when an error of about +1 mm, for example, due to a processing tolerance or an assembly tolerance of a terminal, is included. Therefore, an effect of effective electromagnetic shielding can be obtained. Furthermore, when the gap is designed to be minus, a higher effect can be obtained.

In the case of negative feedback, as illustrated in FIG. 5B, a manner of change in the mutual inductance (MI) is reversed from that in the case of positive feedback. When the gap between the gate terminal 18 and the emitter sense terminal 19 is 1 mm or less, the mutual inductance (MI) between the gate terminal 18 and the emitter sense terminal 19 is high. Here, in the case of negative feedback, while the loop current 104 by the induction magnetic field 103 has an effect of suppressing the transient response contrary to the case of positive feedback, conversely, a disadvantage is involved that a switching speed is slowed down to increase a loss. Here, in a case where the mutual inductance (MI) is high as in the region A and the region B, while the effect of suppressing the transient response is reduced, it is possible to suppress slowdown of the switching speed and an increase in a loss, which are disadvantages. In the case of the region A, this effect becomes more remarkable. Conversely, in the region C, since the mutual inductance (MI) between the gate terminal 18 and the emitter sense terminal 19 is low, while the transient response can be suppressed, the switching speed is slowed down to increase the loss. Thus, the region B is desirable and the region A is more desirable.

With the structure of the present embodiment, shielding a configuration of negative feedback of a gate-emitter sense circuit approaches absence of feedback (feedback zero), which causes no increase in a transient response unlike in positive feedback, and enables an increase in a switch loss to be suppressed.

Although in FIGS. 5A and 5B, the description has been made of the case where the gap between the gate terminal 18 and the emitter sense terminal 19 in the depth direction is 1 mm, when the gap in the depth direction increases, the mutual inductance (MI) increases in both the case of positive feedback and the case of negative feedback. Since the mutual inductance (MI) is desirably small, the gap in the depth direction is desirably 2 mm or less. In consideration of a machine tolerance and machining accuracy, the gap in the depth direction is desirably 0.5 mm or more and 1.5 mm or less. Note that the gap in the depth direction may be further narrowed as long as insulation between the terminals can be secured by application of a printed circuit board, a laminated structure, or the like.

With the configuration of the power semiconductor module 1 of the present embodiment described in the foregoing, it is possible to realize a highly reliable power semiconductor module capable of effectively suppressing an influence of an induction magnetic field generated by a current flowing through the main circuit wiring on the gate terminal and the emitter sense terminal.

In addition to the control signals for the gate terminals 18 and 28 and the like, for example, a sense signal terminal (temperature/current (di/dt) detection) such as a current detection terminal indicated by reference numeral 27 or a thermistor terminal indicated by reference numeral 16 in FIG. 1 can suppress an induced current from a main current magnetic field by adding the same electromagnetic shield structure, such as shielding between the current detection terminal 27 and the emitter sense terminal 29 and between the thermistor terminal 16 and the emitter sense terminal 19, resulting in having effects of reducing noise and preventing malfunction.

Second Embodiment

Figure 6A:
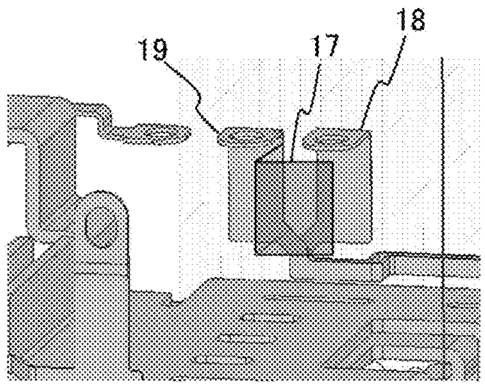
FIG. 6A is a view illustrating a shield part according to a second embodiment of the present invention.
Figure 6B:
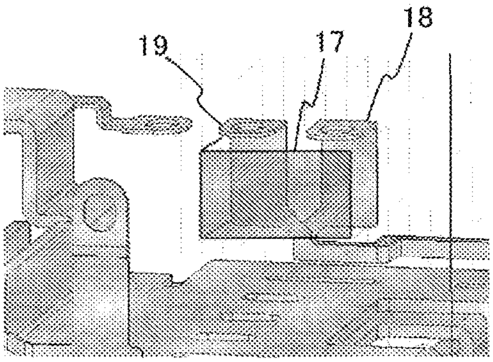
FIG. 6B is a view illustrating a modification of FIG. 6A.
Figure 6C:
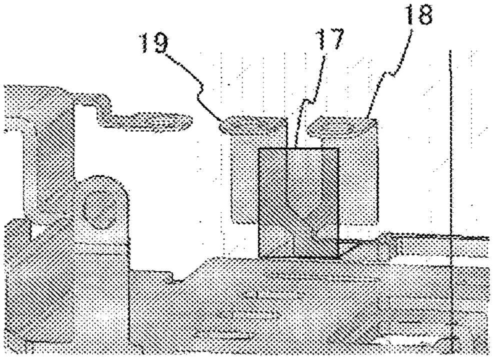
FIG. 6C is a view illustrating a modification of FIG. 6A.

A power semiconductor module according to a second embodiment of the present invention will be described with reference to FIGS. 6A to 6C. FIGS. 6A to 6C each illustrate a variation of the electromagnetic shield part 17.

As illustrated in FIGS. 6A to 6C, the electromagnetic shield part 17 of the present embodiment has a bent shape and is formed integrally with the emitter sense terminal 19, for example, and is disposed so as to overlap the gate terminal 18 and the emitter sense terminal 19 in a depth direction of the electromagnetic shield part 17 with a predetermined gap.

In other words, as illustrated in FIGS. 6A to 6C, the electromagnetic shield part 17 is configured to have a part where a part of at least one of the gate terminal 18 and the emitter sense terminal 19 integrally extends to the other side.

As in the present embodiment, the electromagnetic shield part 17 may have a bent shape, and may not necessarily be on the same plane as the gate terminal 18 and the emitter sense terminal 19.

Even in a case where the electromagnetic shield part 17 is disposed as illustrated in FIGS. 6A to 6C, the same effect as that of the first embodiment can be obtained.

Third Embodiment

Figure 7A:
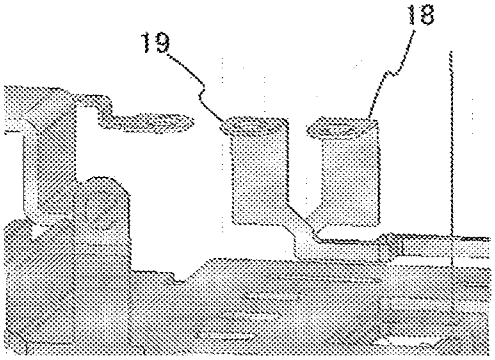
FIG. 7A (Prior Art)
FIG. 7A is an enlarged view of the vicinity of the gate terminal and the emitter sense terminal of the conventional power semiconductor module.

A power semiconductor module according to a third embodiment of the present invention will be described with reference to FIGS. 7A to 7C. FIG. 7A is an enlarged view of the vicinity of the gate terminal 18 and the emitter sense terminal 19 of the conventional power semiconductor module 51 illustrated for comparison, and FIGS. 7B and 7C both illustrate variations of the electromagnetic shield part 17.

Figure 7B:
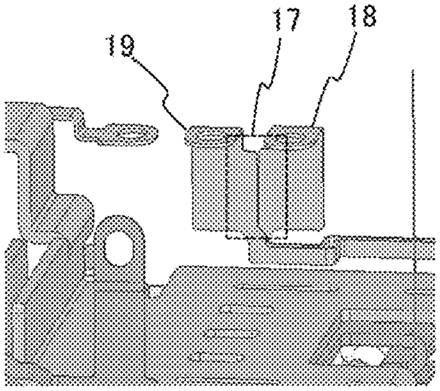
FIG. 7B is a view illustrating a shield part according to a third embodiment of the present invention.
Figure 7C:
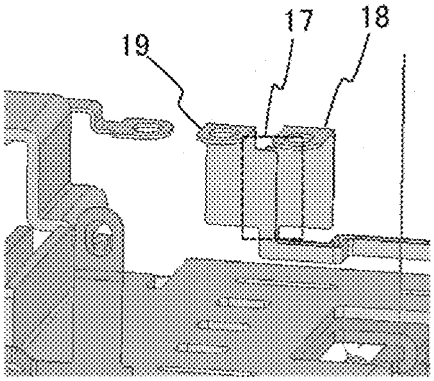
FIG. 7C is a view illustrating a modification of FIG. 7B.

A difference from the second embodiment is that the electromagnetic shield part 17 is not bent unlike the second embodiment, but is integrally formed on the same plane as the gate terminal 18 and the emitter sense terminal 19 as illustrated in FIGS. 7B and 7C, and illustrated here as an example is a case in which the electromagnetic shield part 17 is configured to have a part where a part of each of the gate terminal 18 and the emitter sense terminal 19 extends integrally to the other side.

For example, as illustrated in FIG. 7C, the electromagnetic shield part 17 can be configured such that the electromagnetic shield part 17 integrally formed with the gate terminal 18 and the electromagnetic shield part 17 integrally formed with the emitter sense terminal 19 overlap when viewed from the direction in which the magnetic flux of the induction magnetic field interlinks with the electromagnetic shield part 17. Also, as illustrated in FIG. 7B, when viewed from the direction in which the magnetic flux of the induction magnetic field interlinks with the electromagnetic shield part 17, ends of the two electromagnetic shield parts 17 can be configured to have ends thereof at substantially the same position (the gap is exactly 0 mm).

Note that also in the third embodiment, the electromagnetic shield part 17 need only be configured to have a part where a part of at least one of the gate terminal 18 and the emitter sense terminal 19 integrally extends to the other side. Specifically, the electromagnetic shield part 17 may include only a part integrally formed with the gate terminal 18, or may include only a part integrally formed with the emitter sense terminal 19.

Even in a case where the electromagnetic shield part 17 is installed as illustrated in FIG. 7B or FIG. 7C, the same effects as those of the first embodiment can be obtained. In this case, there is also an effect of reducing self-inductance due to inductance coupling.

Note that the effect of shielding by the electromagnetic shield part 17 is greater at an electrode close to the main current wiring. Since an induction magnetic field is inversely proportional to the square of a distance, for example, in the first embodiment (FIG. 1), the gate terminal 18 and the emitter sense terminal 19 have a greater effect than the gate terminal 28 and the emitter sense terminal 29, and have effects independently of each other.

Further, although in the first embodiment, the gap width between the gate terminal 18 and the emitter sense terminal 19 is defined, in essence, the effect is exerted by a gap with a small area. For example, even if there exists a part which is partially broad (e.g., a notch or an expansion of a termination part) in terms of structure, the effect is exerted in a narrowed part.

In addition, although in the first embodiment, the description has been made assuming a configuration of a 2-in-1 type power semiconductor module, the same effect can be obtained even in a module having a different wiring such as a 1-in-1 type or a 6-in-1 type.

In addition, a main current causing an induced current of signal wiring is not limited to a main current wiring inside the module, but an adjacent external bus bar wiring connected to the module is also applicable, and the structure of the present invention is also effective for shielding an induced current of this wiring.

Note that the present invention is not limited to the above-described embodiments, and includes various modifications. For example, the above embodiments have been described in detail for easy understanding of the present invention, and are not necessarily limited to those having all the described configurations. In addition, a part of the configuration of a certain embodiment can be replaced with the configuration of another embodiment, and to the configuration of a certain embodiment, the configuration of another embodiment can be added. In addition, it is possible to add, delete, and replace other configurations with respect to a part of the configuration of each embodiment.

REFERENCE SIGNS LIST

1 power semiconductor module
2 AC terminal
3 positive electrode terminal
4 negative electrode terminal
5 first insulating wiring board (of upper arm part)
6 second insulating wiring board (of upper arm part)
7 third insulating wiring board (of lower arm part)
8 fourth insulating wiring board (of lower arm part)
10 lower arm part
12 emitter wiring part (on third insulating wiring board 7)
13 collector wiring part (on third insulating wiring board 7)
14 emitter wiring part (on fourth insulating wiring board 8)
15 collector wiring part (on fourth insulating wiring board 8)
16 thermistor terminal
17 electromagnetic shield part
18 gate terminal (of lower arm part)
18*a* gate terminal connection part
19 emitter sense terminal (of lower arm part)
19*a* emitter sense terminal connection part
20 upper arm part
22 emitter wiring part (on first insulating wiring board 5)
23 collector wiring part (on first insulating wiring board 5)
24 emitter wiring part (on second insulating wiring board 6)
25 collector wiring part (on second insulating wiring board 6)
26 electromagnetic shield part
27 current detection terminal (of upper arm part)
28 gate terminal (of upper arm part)
28*a* gate terminal connection part
29 emitter sense terminal (of upper arm part)
29*a* emitter sense terminal connection part
30 wiring between upper arm and lower arm
31 wiring between upper arm and lower arm
40 base plate
51 conventional power semiconductor module
100 IGBT chip
101 diode chip
102 main current
103 induction magnetic field
104 loop current
G gap
MI mutual inductance

The invention claimed is:

1. A power semiconductor module comprising:
a gate terminal to which a control signal is input;
a reference potential terminal disposed adjacent to the gate terminal with a predetermined gap;
a main circuit wiring disposed in the vicinity of the gate terminal and the reference potential terminal; and
an electromagnetic shield that is disposed between the gate terminal and the reference potential terminal and shields an induction magnetic field generated by a current flowing through the main circuit wiring,
wherein the electromagnetic shield is formed integrally with at least one of the gate terminal and the reference potential terminal, and
between the gate terminal and the reference potential terminal, a gap not shielded by the electromagnetic shield when viewed from a direction in which a magnetic flux of the induction magnetic field interlinks with the electromagnetic shield is 1 mm or less.

2. The power semiconductor module according to claim 1, wherein the gap is 0 mm.

3. The power semiconductor module according to claim 2, wherein the electromagnetic shield and the gate terminal or the reference potential terminal overlap each other, or the electromagnetic shields overlap each other when viewed from the direction in which the magnetic flux of the induction magnetic field interlinks with the electromagnetic shield.

4. The power semiconductor module according to claim 3, wherein a width of the overlap of the electromagnetic shield with the gate terminal or with the reference potential terminal, or a width of the overlap of the electromagnetic shields when viewed from the direction in which the magnetic flux of the induction magnetic field interlinks with the electromagnetic shield is 2 mm or more.

5. The power semiconductor module according to claim 1, wherein the electromagnetic shield has a part where a part of at least one of the gate terminal and the reference potential terminal integrally extends to the other side.

6. The power semiconductor module according to claim 5, wherein the electromagnetic shield has a part where a part of each of the gate terminal and the reference potential terminal extends integrally to the other side.

7. The power semiconductor module according to claim 1, wherein the magnetic flux of the induction magnetic field is interlinked between the gate terminal and the reference potential terminal by positive feedback.

8. The power semiconductor module according to claim 1, wherein the magnetic flux of the induction magnetic field is interlinked between the gate terminal and the reference potential terminal by negative feedback.

9. The power semiconductor module according to claim 1, wherein the reference potential terminal is an emitter sense terminal or a source sense terminal.

10. A power conversion device mounted with the power semiconductor module according to claim 1.

* * * * *